United States Patent [19]

Fotouhi

[11] Patent Number: 5,959,494

[45] Date of Patent: Sep. 28, 1999

[54] HIGH-VOLTAGE SWITCH CONTROL

[75] Inventor: Bahram Fotouhi, Cupertino, Calif.

[73] Assignee: Exar Corporation, Fremont, Calif.

[21] Appl. No.: 08/916,806

[22] Filed: Aug. 22, 1997

[51] Int. Cl.[6] .............................................. H03K 17/687
[52] U.S. Cl. ............................................. 327/427; 327/77
[58] Field of Search ............................. 327/77, 108, 109, 327/110, 111, 309, 327, 427, 198

[56] References Cited

U.S. PATENT DOCUMENTS

| | | | |
|---|---|---|---|
| 5,028,811 | 7/1991 | Le Roux et al. | 307/270 |
| 5,165,046 | 11/1992 | Hesson | 307/270 |
| 5,576,648 | 11/1996 | Rossi et al. | 327/108 |
| 5,801,572 | 9/1998 | Nakamura | 327/427 |

*Primary Examiner*—Timothy P. Callahan
*Assistant Examiner*—Jeffrey Zweizig
*Attorney, Agent, or Firm*—Townsend & Townsend & Crew LLP

[57] ABSTRACT

Method and circuitry for reliably controlling the state of a transistor switch under high voltage conditions are disclosed. The present invention monitors the level of an external signal applied to one terminal of the switch. If the level of the external signal is lower than a reference voltage such as the power supply voltage of the integrated circuit that comprises the switch, the control of the switch is passed to a digital signal internal to the integrated circuit. If the level of the external signal exceeds the reference voltage, then the present invention operates to allow the switch to be controlled by the external signal. This ensures that the switch is turned off, and remains off when it interfaces with voltages with absolute magnitudes higher than the highest internal voltage. The invention further ensures that the switch is turned off when no power is applied to the switch control circuit.

26 Claims, 2 Drawing Sheets

HIGH-VOLTAGE SWITCH CONTROL

BACKGROUND OF THE INVENTION

The present invention relates in general to integrated circuits and in particular to a method and circuitry for reliably controlling the state of a switch under varying voltage conditions.

Metal-oxide-semiconductor (MOS) transistors are often used to perform switching function in integrated circuits. While the MOS transistor makes a reliable switch in most circuit applications, there are certain circuit applications that place severe operational constraints on the MOS switch. For example, in telecommunication circuitry a transmitter/receiver integrated circuit (IC) may be required to interface with signals having absolute magnitudes much larger than the power supply voltage for the IC. Controlling the on and off state of an MOS switch in the IC that interfaces with the external signal becomes a challenging task.

For example, if a p-channel MOS transistor is used to switch an input signal that may swing ±15 volts (or ±25 volts), turning off the switch and keeping it off when the internal power supplies run between ±5 volts (or ±12 volts) is problematic. Charge pump techniques may be used to internally generate high enough voltages to drive the gate of the p-channel switch. However, when the IC is not powered, the charge pump circuitry does not generate the desired voltage and the switch may be turned on. When using multiple p-channel switches that connect the input terminal to various different types of circuits, having switches that may be randomly turned on at the same time may cause damage to the circuitry.

There is therefore a need for reliably controlling the state of a switch transistor that operates on various high voltage conditions.

SUMMARY OF THE INVENTION

The present invention provides method and circuitry for reliably controlling the state of a transistor switch under high voltage condition. Broadly, the present invention monitors the level of an external signal applied to one terminal of the switch. If the level of the external signal is lower than a reference voltage such as the power supply voltage of the integrated circuit that comprises the switch, the control of the switch is passed to a digital signal internal to the integrated circuit. If the level of the external signal exceeds the reference voltage, then the present invention operates to allow the switch to be controlled by the external signal. This ensures that the switch is turned off, and remains off when it interfaces with voltages with absolute magnitudes higher than the highest internal voltage. The present invention also ensures proper operation of the switch when power is not applied to the circuit controlling the switch.

Accordingly, in one embodiment, the present invention provides an integrated circuit having an input terminal adapted to receive an external signal, wherein the integrated circuit includes a transistor switch having a first terminal coupled to the input terminal, and a control terminal; a comparator having a first terminal coupled to an internal reference voltage, a second terminal coupled to receive the external signal, and an output terminal; and a select circuit having a first input terminal coupled to an internal logic signal and a second input terminal coupled to the output of the comparator, wherein the select circuit couples either the internal logic signal or the external signal to the gate terminal of the transistor switch in response to the output of the comparator.

In a specific embodiment, the select circuit comprises a tri-state circuit having an input terminal coupled to the internal logic signal, a tri-state input terminal coupled to the output of the comparator, and an output coupled to the gate of the transistor switch. The select circuit further includes a switch circuit coupled between the first terminal and the gate terminal of the transistor switch, wherein the switch circuit receives the output of the comparator as control signal.

In another embodiment, the present invention provides a method of controlling a transistor switch in an integrated circuit, comprising the steps of: (A) monitoring a magnitude of an external signal applied to the transistor switch; (B) coupling a control terminal of the transistor switch to an internal digital signal in a first mode of operation; and (C) coupling the control terminal of the transistor switch to receive the external signal in a second mode of operation.

A better understanding of the nature and advantages of the method and circuit of the present invention may be gained with reference to the detailed description and the drawings below.

DESCRIPTION OF THE PREFERRED EMBODIMENT

Figure 1:
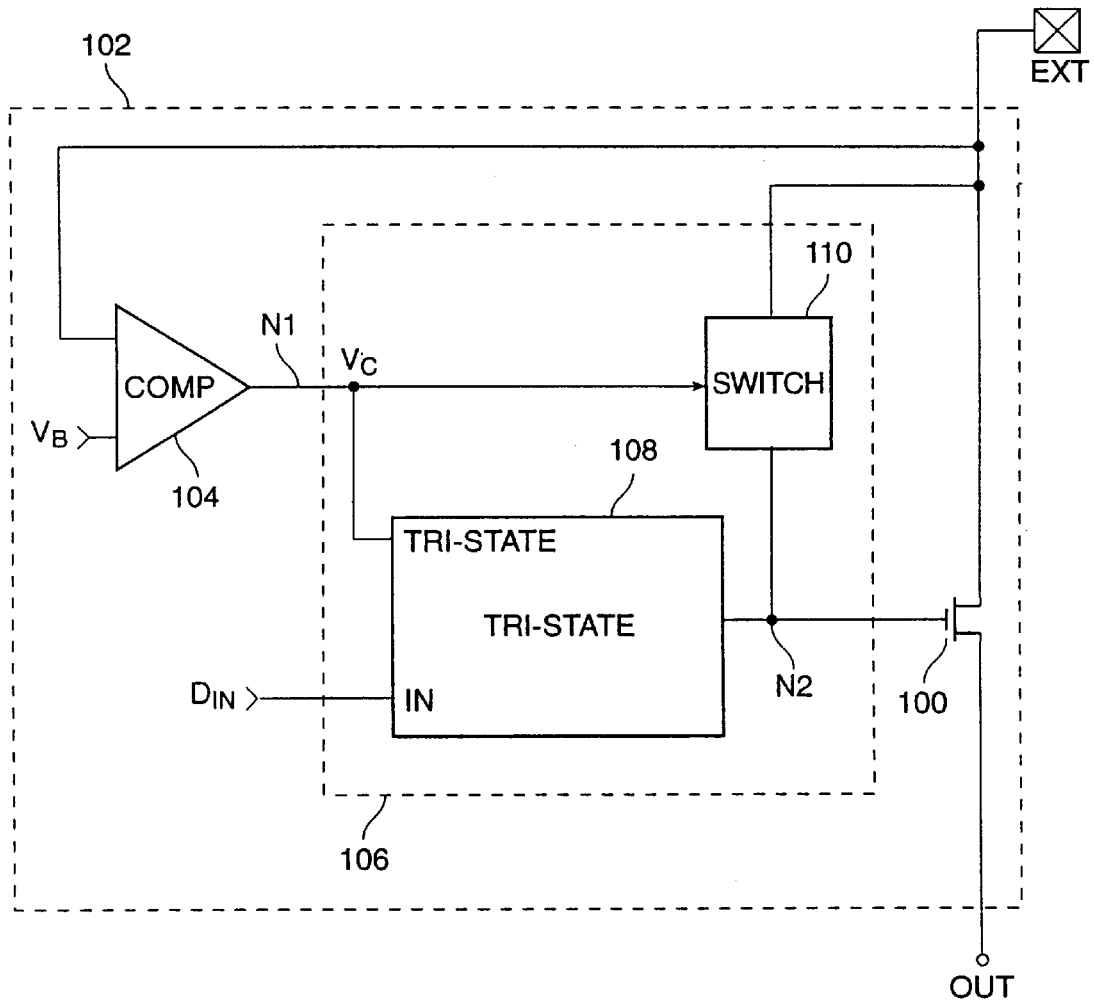
FIG. 1 is a simplified block diagram of the switch control circuit according to one embodiment of the present invention.

Referring to FIG. 1, there is shown a simplified block diagram of the high voltage switch control circuit of the present invention. An MOS transistor 100 is a high voltage switch connecting an external node EXT to an output node OUT when turned on. Output node OUT may be another external node or an internal node that connects to other internal circuitry in need of protection from high voltages at EXT. MOS switch 100 is fabricated inside an integrated circuit 102 that provides the control signal for switch 100. The control circuitry for switch 100 includes a comparator 104 that receives EXT at one input and an internal reference (or bias) signal $V_B$ at another input. A select circuit 106 receives the output signal Vc of comparator 104 at one input (node N1), and a digital signal Din at another. Select circuit 106 operates to supply to the gate terminal of switch 100 (or node N2) either the digital signal Din or the signal at EXT.

Select circuit 106 includes a tri-state circuit 108 that receives the output Vc of comparator 104 at a tri-state input and the Din signal at another. The output of tri-state circuit 108 drives the gate terminal of switch 100. Select circuit 106 further includes a switch circuit 110 that supplies the signal at EXT to the gate terminal of switch 100 in response to the control signal Vc at the output of comparator 104. Thus, depending on the comparative magnitudes of the signal at EXT and $V_B$, the signal Vc either tri-states circuit 108 and closes switch circuit 110 to connect EXT to node N2, or the signal Vc opens switch circuit 110 and allows Din to drive the gate terminal of switch 100.

Figure 2:
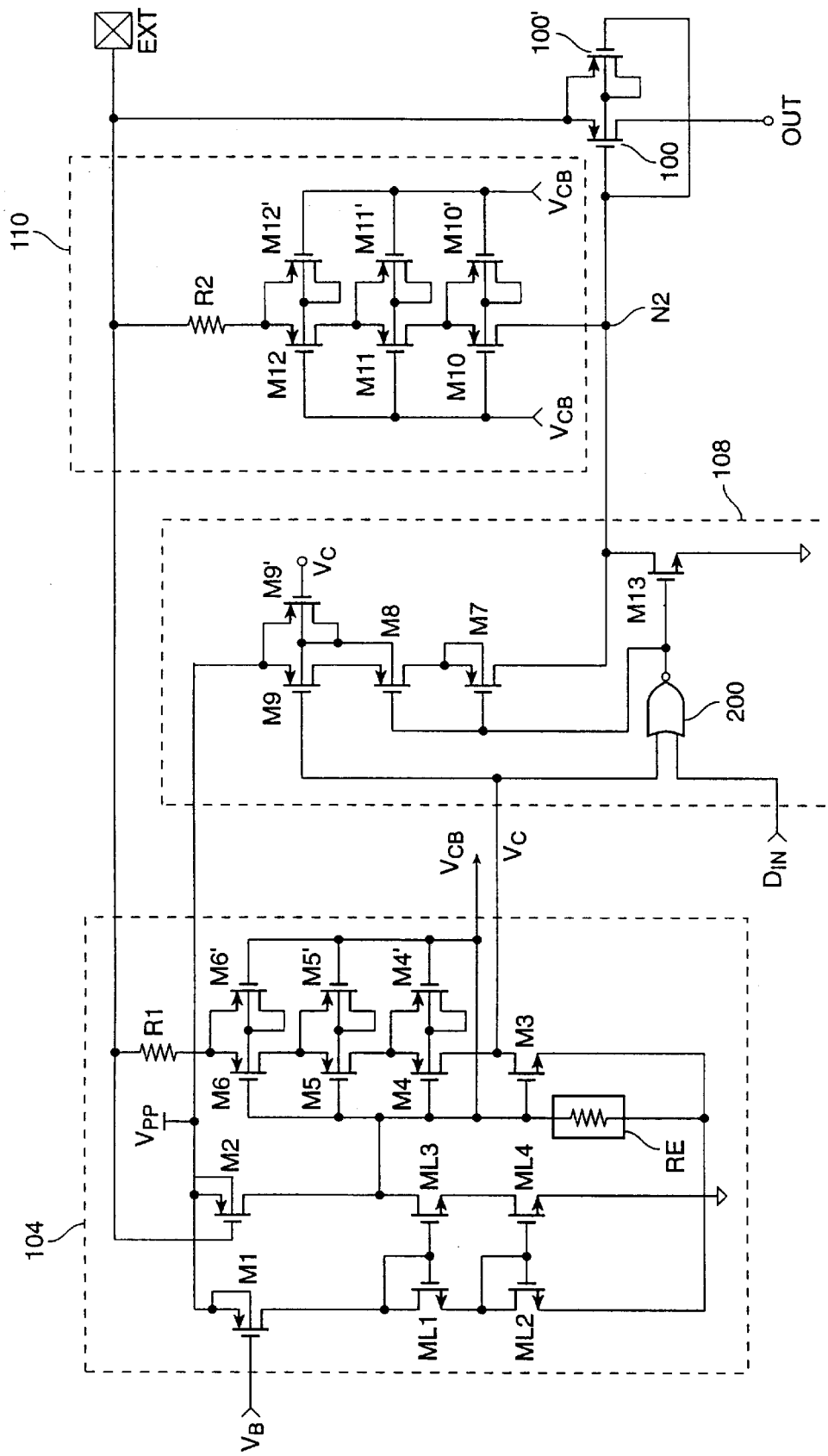
FIG. 2 is an exemplary transistor implementation of the switch control circuit of the present invention.

The operation of the circuit of the present invention will be described in greater detail hereinafter in connection with FIG. 2. Referring to FIG. 2, there is shown an exemplary transistor-level implementation of the high voltage switch control circuit of the present invention. The circuit shown in FIG. 2 assumes an N-well CMOS process and implements switch 100 by a p-channel transistor that can have its bulk (N-well) independently biased. It is to be understood that the use of a p-channel device is for illustrative purposes only, and that the advantages of the present invention can be obtained by similar circuitry fabricated in a P-well process where the switch would be an n-channel transistor, and the signal polarities would be reversed.

The same reference numerals are used in both FIGS. 1 and 2 to identify the same elements and blocks. Comparator 104 is made of an input stage with input transistors M1 and M2 along with their current-mirror load transistors ML1, ML2, ML3, and ML4. Input transistor M1 connects to a reference voltage $V_B$ and input transistor M2 connect to EXT. The reference voltage $V_B$ may be set to a voltage slightly lower (e.g., about one transistor threshold voltage) than Vpp. The output stage of comparator 104 includes an inverter made up of a pull-down n-channel transistor M3 and three serially-connected pull-up p-channel transistors M4, M5, and M6 that connect to EXT via a resistor R1. The bulk terminal of each p-channel pull-up transistor connects to its source terminal via a dedicated p-channel switch transistor (M4', M5', M6') whose gate terminal is controlled by the complementary output Vcb of comparator 104. A resistive element RE connects node Vcb to ground.

Tri-state circuit 108 includes a NOR gate 200 that receives Din at one input and Vc at the other. The output of NOR gate 200 drives an inverter made up of an n-channel pull-down transistor M13 that is connected to two serially-connected p-channel pull-up transistors M7 and M8. A third p-channel transistor M9 connects the inverter to the positive power supply Vpp, in response to Vc. The bulk terminal of transistor M9 is switched to its source by transistor M9'. The output of the inverter drives node N2 at the gate terminal of switch transistor 100. P-channel switch transistor 100 has its bulk terminal switched to its source terminal by p-channel transistor 100'.

Switch circuit 110 connects to node N2 by two serially connected p-channel transistors M10 and M11 that have their gate terminals driven by Vcb, and their bulk terminals switched to their source by transistors M10' and M11', respectively. A third p-channel transistor M12 connects the M10/M11 pair to EXT via a resistor R2. The bulk terminal of transistor M12 is also switched to its source terminal by p-channel transistor M12'. The gate terminals of transistors M10, M10', M11, M11' and M12, M12' are controlled by Vcb.

In a first mode of operation, when the magnitude of the signal at EXT is lower than $V_B$, M2 turns on pulling node Vcb up to Vpp. With Vcb at a high voltage, n-channel transistor M3 turns on and p-channel transistors M4, M5 and M6 turn off. This pulls node Vc down to ground (or Vss). With Vc at ground, the state of node N2 (and therefore switch 100) is determined by the internally generated digital signal Din. To turn switch 100 off, a high logic value is applied to Din causing the output of NOR 200 to drop down to ground. This turns M13 off and M7, and M8 on. Since Vc is at ground, M9 is also on, causing node N2 to be pulled up to Vpp. Transistor M12 in switch circuit 100 is also off given its biasing condition wherein its source is at EXT which is at a lower level than Vcb applied to its gate terminal.

Thus, the gate terminal of switch transistor 100 is at Vpp and its source terminal (EXT) is at a level that is lower in magnitude than Vpp. Switch 100 is therefore turned off. P-channel transistor 100' which is biased similarly is also turned off, allowing the bulk terminal of switch transistor 100 to float. The bulk terminal floats towards a voltage one diode (transistor bulk/source junction) drop below its source terminal keeping switch 100 off. This also helps transistor 100 to withstand higher voltages at its source terminal (EXT) without permanent electrical damage.

To turn on switch 100 in the first mode of operation, a low logic value is applied at Din causing the output of NOR 200 to be pulled up to Vpp. This turns M13 on pulling node N2 down to ground. Transistor M12 is still off, disconnecting EXT from node N2. Accordingly, the gate terminal of switch transistor 100 is at ground, or the lowest voltage in the circuit. This causes switch 100 to be turned on connecting EXT to OUT. This biasing condition also turns p-channel transistor 100' on, shorting the bulk terminal of p-channel transistor 100 to its source. This reduces the on-resistance of transistor 100 providing a more conductive path between EXT and OUT.

This technique of switching the bulk terminal of the p-channel transistor depending on its state is preferably employed for transistors M4, M5, and M6, M8 and M9, as well as M10, M11, and M12. This protects the transistors in case of large excursions of the signal on EXT in the negative direction. That is, in this first mode of operation, if the signal on EXT swings in the negative direction in large magnitudes, with Vc at ground, transistors M4 through M6 and M10 through M12 must sustain a large voltage difference. The ability to float the bulk terminal of these transistors protects them against high voltage stress and possible permanent electrical damage. Further, to eliminate the possibility of a reverse-biased source/drain to bulk breakdown for these transistors, three (instead of one) transistors are used in the pull-up path.

A second mode of operation is defined by the condition wherein the magnitude of the signal at EXT exceeds that of the reference voltage $V_B$. Under this condition, transistor M1 in comparator 104 is turned on causing Vcb to be pulled to ground and Vc toward EXT. With a logic high value Vc at one input, the output of NOR gate 200 is pulled down to ground. This turns off transistor M13 off and turns on transistors M7 and M8. However, the high voltage level at Vc causes p-channel transistor M9 to be turned off disconnecting the pull-up path from Vpp. The output of tri-state circuit 108 is tri-stated regardless of the state of the internal digital signal Din.

With Vcb at ground, all p-channel transistors M10, M10', M11, M11' and M12, M12' in switch circuit 110 are turned on. Thus, switch circuit 110 provides a conductive path between node N2 and EXT. By connecting the source and gate terminals of switch transistor 100 to the same potential, the circuit ensures that switch 100 remains off, regardless of the magnitude of the signal at EXT.

In the second mode of operation, the increasing voltage at EXT reverse biases the N-well to substrate junction diodes connected to EXT. This voltage may be high enough to reach the junction breakdown voltage levels of the diode. Resistors R1 and R2 are inserted between EXT and transistors M6/M6' and M9, M12/M12' to limit the junction breakdown current. These resistors also operate to limit current dissipation when the signal at EXT drops to a level lower than the substrate voltage Vss forward biasing N-well to substrate diodes. Further, in this mode, when the signal at EXT which is coupled to node N2 pulls above Vpp, transistors M9/M9' operate to prevent reverse current from node N2 to Vpp through M7 and M8. The gate terminals of M9/M9' track the voltage at EXT and their bulk terminals rise to one diode drop below the voltage at EXT. This ensures that M9/M9' remain off disconnecting the reverse current path between node N2 and Vpp. Transistors M7 and M8 help reduce the reverse-biased voltage on source/drain and N-well junctions as the signal at EXT approaches voltages equal or greater than twice Vpp.

A resistive element RE connects Vcb to ground. The function of this resistive element RE is to pull Vcb to ground in the absence of a circuit power supply voltage. This resistive element is weak enough such that when power is supplied, the operation of transistors in comparator 104 easily overpower the pull-down ability of the resistor. By thus pulling Vcb to ground when there is no power supply voltage, the circuit connects the source and gate terminals of switch 100 together. This ensures that switch 100 remains off even in the absence of a power supply voltage.

In conclusion, the present invention offers method and circuitry for reliably controlling the state of a transistor switch under high voltage condition. While the above is a complete description of the preferred embodiment of the present invention, it is possible to use various alternatives, modifications and equivalents. For example, an n-channel transistor could be used as the switch which would reverse the polarities of the signals. Therefore, the scope of the present invention should be determined not with reference to the above description but should, instead, be determined with reference to the appended claims, along with their full scope of equivalents.

What is claimed is:

1. An integrated circuit having an external terminal adapted to receive an external signal, the integrated circuit comprising:
    a transistor switch having a first terminal coupled to the external terminal, and a gate terminal;
    a comparator having a first terminal coupled to an internal reference voltage, a second terminal coupled to receive the external signal, and an output terminal; and
    a select circuit having a first input terminal coupled to an internal logic signal and a second input terminal coupled to the output of the comparator,
    wherein, the select circuit couples either the internal logic signal or the external signal to the gate terminal of the transistor switch in response to the output of the comparator.

2. The integrated circuit of claim 1 wherein the select circuit comprises:
    a tri-state circuit having an input terminal coupled to the internal logic signal, a tri-state input terminal coupled to the output of the comparator, and an output terminal coupled to the gate terminal of the transistor switch; and
    a switch circuit coupled between the first terminal and the gate terminal of the transistor switch,
    wherein, the switch circuit receives the output of the comparator as control signal.

3. The integrated circuit of claim 2 further comprising a switch coupled to a bulk terminal of the transistor switch, wherein the switch couples the bulk terminal of the transistor switch to its first terminal when closed, and leaves the bulk terminal floating when open.

4. The integrated circuit of claim 3 wherein the switch is a transistor having a first terminal coupled to the external terminal, a gate terminal coupled to the gate terminal of the transistor switch, a bulk terminal coupled to the bulk terminal of the transistor switch, and a second terminal coupled to its bulk terminal.

5. The integrated circuit of claim 2 wherein the transistor switch comprises a p-channel MOS transistor.

6. The integrated circuit of claim 5 wherein the tri-state circuit comprises circuitry for performing an OR function between the internal logic signal and the output of the comparator.

7. The integrated circuit of claim 6 wherein the circuitry for performing an OR function further comprises:
    a NOR gate having a first input coupled to receive the internal logic signal, a second input coupled to receive the output of the comparator and an output; and
    an inverting circuit having a pull-down transistor for coupling the gate terminal of the transistor switch to a low voltage in response to the output of the NOR gate, and a pull-up circuit for coupling the gate terminal of the transistor switch to a high voltage in response to the output of the NOR gate and the output of the comparator.

8. The integrated circuit of claim 7 wherein the pull-up circuit in the inverting circuit comprises:
    a first p-channel MOS transistor having a gate terminal coupled to the output of the NOR gate, and first source/drain terminal coupled to the gate terminal of the transistor switch, and a second source/drain terminal; and
    a second p-channel MOS transistor having a gate terminal coupled to the output of the comparator, a first source/drain terminal coupled to the second source/drain terminal of the first p-channel transistor, and a second source/drain terminal coupled to receive the high voltage.

9. The integrated circuit of claim 8 wherein the pull-up circuit in the inverting circuit further comprises a third p-channel transistor having a first source drain terminal coupled to its bulk terminal and a bulk terminal of the second p-channel transistor, a gate terminal coupled to the output of the comparator, and a second source/drain terminal coupled to the second source/drain terminal of the second p-channel transistor.

10. The integrated circuit of claim 9 wherein the pull-up circuit in the inverting circuit further comprises a fourth p-channel transistor having first and second source/drain terminals coupled between the first and the second p-channel transistor, and a gate terminal coupled to the output of the NOR gate.

11. The integrated circuit of claim 5 wherein the switch circuit comprises:
    a first p-channel transistor having a first source/drain terminal coupled to the gate terminal of the transistor switch, a gate terminal coupled to a complement of the output of the comparator, and a second source/drain terminal; and
    a second p-channel transistor having a first source/drain terminal coupled to the second source/drain terminal of the first p-channel transistor, a gate terminal coupled to the gate terminal of the first p-channel transistor and a second source/drain terminal coupled to the external terminal.

12. The integrated circuit of claim 11 wherein the switch circuit further comprises a resistive element coupled between the second p-channel transistor and the external terminal.

13. The integrated circuit of claim 11 wherein the switch circuit further comprises a third p-channel transistor having first and second source/drain terminals coupled between the first and the second p-channel transistors, and a gate terminal coupled to the gate terminal of the first p-channel transistor.

14. The integrated circuit of claim 12 wherein the switch circuit further comprises:
    a fourth p-channel transistor coupled to said first p-channel transistor, said fourth p-channel transistor either coupling a bulk terminal of the first p-channel transistor to its source terminal, or allowing the bulk terminal of the first p-channel transistor to float;

a fifth p-channel transistor coupled to said second p-channel transistor, said fifth p-channel transistor either coupling a bulk terminal of the second p-channel transistor to its source terminal, or allowing the bulk terminal of the second p-channel transistor to float; and a sixth p-channel transistor coupled to said third p-channel transistor, said sixth p-channel transistor either coupling a bulk terminal of the third p-channel transistor to its source terminal, or allowing the bulk terminal of the third p-channel transistor to float.

15. The integrated circuit of claim 1 further comprising a grounding circuit coupled to the output of the comparator, wherein the grounding circuit controls the select circuit to couple the gate terminal of the transistor switch to the external terminal when no power is supplied to the integrated circuit.

16. The integrated circuit of claim 5 wherein the comparator comprises:

an input stage receiving the external signal at one input and the internal reference signal at another, and generating an output; and an inverting circuit having an input coupled to the output of the input stage, and an output coupled to the output of the comparator.

17. The integrated circuit of claim 16 wherein the inverting circuit comprises:

an n-channel pull-down transistor having a gate terminal coupled to the output of the input stage, and a first source/drain terminal coupled to a low voltage, and a second source/drain terminal coupled to the output of the comparator; and a pull-up circuit coupling the output of the comparator to the external terminal.

18. The integrated circuit of claim 17 wherein the pull-up circuit in the inverting circuit comprises:

a first p-channel transistor having a gate terminal coupled to the output of the input stage, a first source/drain terminal coupled to the output of the comparator, and a second source/drain terminal; and a second p-channel transistor having a gate terminal coupled to the gate terminal of the first p-channel transistor, a first source/drain terminal coupled to the second source/drain terminal of the first p-channel transistor and a second source/drain terminal coupled to the external terminal.

19. The integrated circuit of claim 18 wherein the pull-up circuit in the inverting circuit further comprises a resistive element coupled between the second source/drain terminal of the second p-channel transistor and the external terminal.

20. The integrated circuit of claim 19 wherein the pull-up circuit in the inverting circuit further comprises a third p-channel transistor having first and second source/drain terminals coupled between the first and the second p-channel transistors, and a gate terminal coupled to the output of the input stage.

21. The integrated circuit of claim 20 wherein the pull-up circuit in the inverting circuit further comprises:

a fourth p-channel transistor coupled to said first p-channel transistor, said fourth p-channel transistor either coupling a bulk terminal of the first p-channel transistor to its source terminal, or allowing the bulk terminal of the first p-channel transistor to float;

a fifth p-channel transistor coupled to said second p-channel transistor, said fifth p-channel transistor either coupling a bulk terminal of the second p-channel transistor to its source terminal, or allowing the bulk terminal of the second p-channel transistor to float; and a sixth p-channel transistor coupled to said third p-channel transistor, said sixth p-channel transistor either coupling a bulk terminal of the third p-channel transistor to its source terminal, or allowing the bulk terminal of the third p-channel transistor to float.

22. The integrated circuit of claim 5 wherein the internal reference voltage is substantially equal to an internal power supply voltage.

23. A method of controlling a transistor switch in an integrated circuit, the transistor switch having a first terminal coupled to an external node, the method comprising the steps of:

(A) comparing a magnitude of an external signal on the external node to an internal reference signal;

(B) coupling a control terminal of the transistor switch to an internal signal generated inside the integrated circuit, in a first mode of operation, in response to the step of comparing; and (C) coupling the control terminal of the transistor switch to the external signal on said external node, in a second mode of operation, in response to the step of comparing.

24. The method of claim 23 wherein said first mode of operation is when an absolute magnitude of the external signal is smaller than the reference signal, and said second mode of operation is when the absolute magnitude of the external signal is greater than the reference signal.

25. The method of claim 24 wherein said step of coupling the control terminal of the transistor switch to the external signal comprises the steps of:

turning on a switch circuit coupled between the external node and the control terminal of the transistor switch; and tri-stating an output of a circuit generating said internal signal.

26. The method of claim 25 wherein said step of coupling the control terminal of the transistor switch to the internal signal comprises the steps of:

turning off the switch circuit coupled between the external node and the control terminal of the transistor switch; and applying the output of the circuit generating said internal signal to the control terminal of the transistor switch.

* * * * *